United States Patent
Ford et al.

(10) Patent No.: US 10,761,149 B2
(45) Date of Patent: Sep. 1, 2020

(54) ENERGIZING COIL WOUND ON MAGNETIC CORE AND OSCILLATORY TESTING OF TRANSFORMER

(71) Applicant: VOLTECH INSTRUMENTS, LTD., Abingdon Oxfordshire (GB)

(72) Inventors: John Stewart Ford, Sanibel, FL (US); Lionel Ind, Oxford Oxfordshire (GB)

(73) Assignee: VOLTECH INSTRUMENTS, LTD., Abingdon, Oxfordshire (GB)

( * ) Notice: Subject to any disclaimer, the term of this patent is extended or adjusted under 35 U.S.C. 154(b) by 324 days.

(21) Appl. No.: 15/758,409

(22) PCT Filed: Aug. 16, 2016

(86) PCT No.: PCT/GB2016/052531
§ 371 (c)(1),
(2) Date: Mar. 8, 2018

(87) PCT Pub. No.: WO2017/042529
PCT Pub. Date: Mar. 16, 2017

(65) Prior Publication Data
US 2018/0259565 A1    Sep. 13, 2018

(30) Foreign Application Priority Data

Sep. 9, 2015 (GB) ..................... 1515970

(51) Int. Cl.
*G01R 31/72* (2020.01)
*G01R 31/62* (2020.01)

(52) U.S. Cl.
CPC ............. *G01R 31/72* (2020.01); *G01R 31/62* (2020.01)

(58) Field of Classification Search
CPC ....... G01R 31/72; G01R 31/62; G01R 31/013
(Continued)

(56) References Cited

U.S. PATENT DOCUMENTS 5,982,155 A    11/1999    Rechdan et al.
6,388,417 B1    5/2002    Keith
(Continued)

FOREIGN PATENT DOCUMENTS

CH    707218 A2    5/2014
CN    1169059 A    12/1997
(Continued)

OTHER PUBLICATIONS

International Search Report and Written Opinion prepared by the European Patent Office dated Oct. 28, 2016, for International Application No. PCT/GB2016/052531.
(Continued)

*Primary Examiner* — Farhana A Hoque
(74) *Attorney, Agent, or Firm* — Jason H. Vick; Sheridan Ross, PC

(57) ABSTRACT

Methods and apparatus for energizing a wound component are described. In one arrangement, a method of energizing a component with an alternating voltage is provided. The component comprises a coil wound on a magnetic core. The method comprises applying a voltage across the coil that has a first waveform during a first time period and a second waveform during a second time period. The second time period is subsequent to the first time period. The second waveform comprises an oscillating function comprising a sequence of identical waveforms. The first waveform is such that if the coil had zero electrical resistance the variation of flux density in the magnetic core with time would change sign at least once during the first waveform.

19 Claims, 4 Drawing Sheets

(58) Field of Classification Search
USPC .................................................. 324/127, 547
See application file for complete search history.

(56) References Cited

U.S. PATENT DOCUMENTS

| | | | |
|---|---|---|---|
| 6,522,517 | B1 | 2/2003 | Edel |
| 7,106,078 | B1 | 9/2006 | Frank et al. |
| 2001/0038290 | A1 | 11/2001 | Coffeen |
| 2002/0057091 | A1* | 5/2002 | Hensler .................. G01R 31/34 324/547 |
| 2013/0154649 | A1 | 6/2013 | Candy |
| 2014/0035595 | A1 | 2/2014 | Neti et al. |
| 2014/0320012 | A1* | 10/2014 | Bassom ............ H01J 37/32853 315/111.21 |

FOREIGN PATENT DOCUMENTS

| | | |
|---|---|---|
| CN | 101281168 A | 10/2008 |
| CN | 102948068 A | 2/2013 |
| WO | WO 2011/128660 | 10/2011 |
| WO | WO 2014/066492 | 5/2014 |

OTHER PUBLICATIONS

Notification of First Office Action (Including Translation) for corresponding Chinese Patent Application No. 201680064843.5, dated Nov. 27, 2019.
Written Opinion for International Application No. PCT/GB2016/052531, dated Nov. 8, 2016.
International Preliminary Report on Patentability for International Application No. PCT/GB2016/052531, dated Mar. 13, 2018.

* cited by examiner

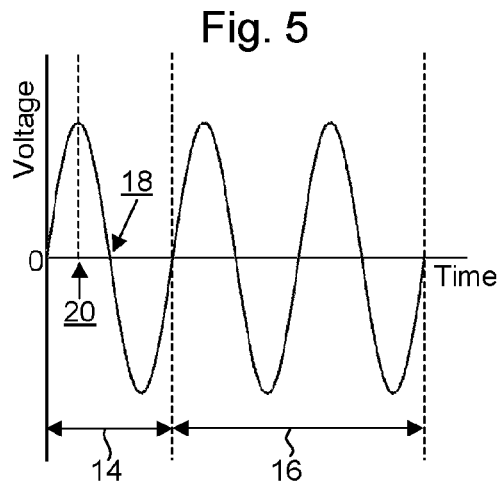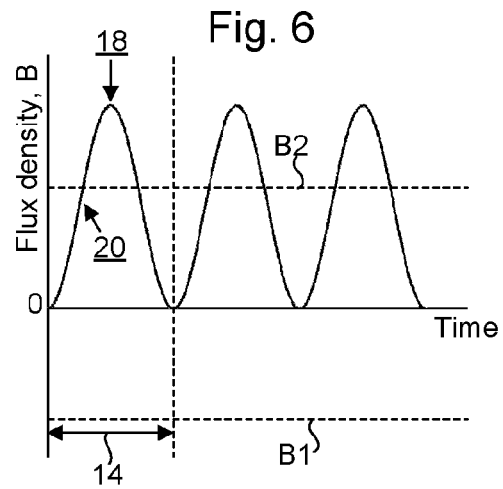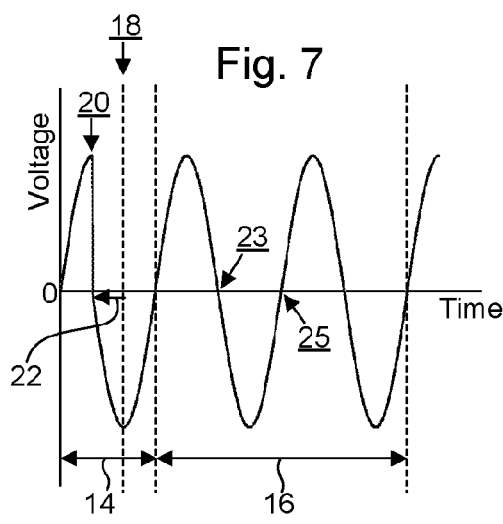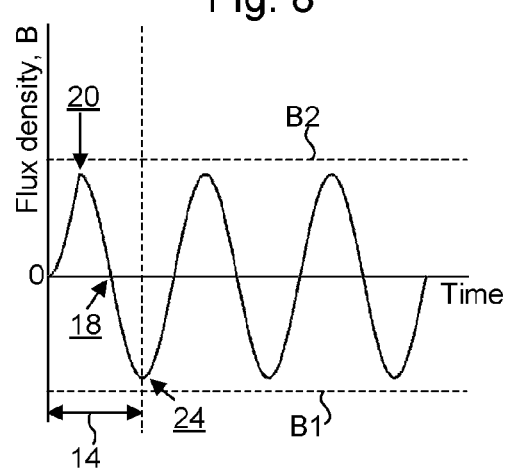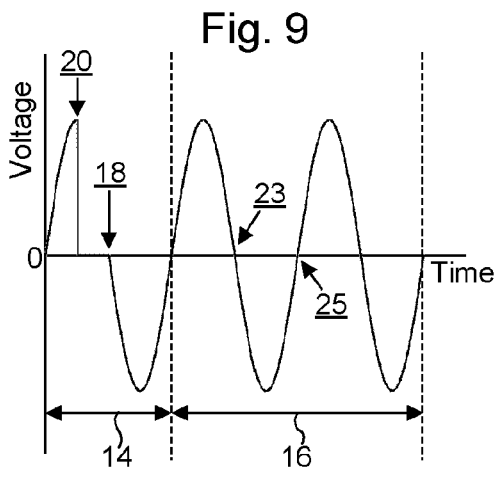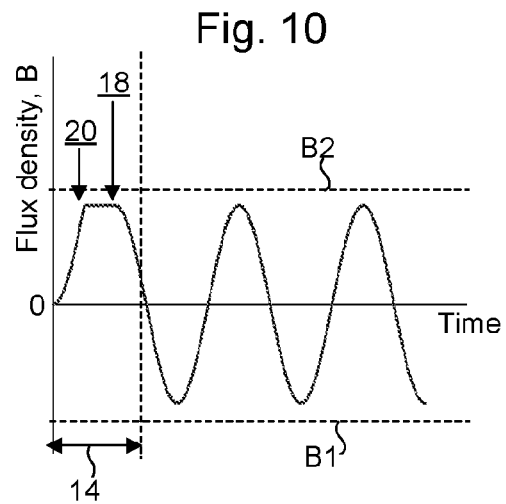

ENERGIZING COIL WOUND ON MAGNETIC CORE AND OSCILLATORY TESTING OF TRANSFORMER

CROSS REFERENCE TO RELATED APPLICATIONS

This application is a national stage application under 35 U.S.C. 371 of PCT Application No. PCT/GB2016/052531, having an international filing date of 16 Aug. 2016, which designated the United States, which PCT application claimed the benefit of Great Britain Patent Application No. 1515970.0 filed 9 Sep. 2015, the contents of each of which are incorporated herein by reference in their entirety.

The present invention relates to energizing a wound component, particularly for the purposes of testing a response of the component when energized by applying an alternating voltage. The invention relates particularly to testing transformers quickly and accurately.

It is known to test transformers by applying a voltage to a primary coil of the transformer and measuring the resulting current. Transient effects occurring when the coil is energized mean that increased accuracy can be achieved by delaying a measurement of the current for a certain period after the component has first been energized. This delay increases the time required for testing, which may be particularly undesirable where a large number of components need to be tested.

It is an object of the invention to provide methods and apparatus which allow components to be energized with an alternating voltage in a way which reduces or eliminates transient effects, thereby allowing accurate measurements of the electrical properties of the components to be carried out more quickly.

According to an aspect of the invention, there is provided a method of energizing a component with an alternating voltage, the component comprising a coil wound on a magnetic core, wherein the method comprises: applying a voltage across the coil that has a first waveform during a first time period and a second waveform during a second time period, the second time period being subsequent to the first time period, wherein the second waveform comprises an oscillating function comprising a sequence of identical waveforms; and the first waveform is such that if the coil had zero electrical resistance the variation of flux density in the magnetic core with time would change sign at least once during the first waveform.

Applying a first waveform which is such as to cause the flux density B to change sign during the first waveform in this manner leads to the variation in flux density making effective use of a linear region in the B-H curve earlier than would be achieved using prior art arrangements. In prior art arrangements, B only changes sign due to resistive losses in the coil, which cause the variation of B with time to gradually become centred on zero (i.e. to oscillate with an average value of zero). If an alternating voltage having a pure sinusoidal form is applied to a coil which does not have any resistance, the flux density will never change sign. The transient effects referred to above occur during the time period when the variation of B is not centred on zero. During this time the variation of B is more likely to enter a non-linear region of the B-H curve, or to enter the non-linear regime to a greater extent, than is the case at later times or in the steady-state regime (e.g. when B is centred on zero). Undesirable effects, such as peak current distortion, occur when B enters the non-linear region of the B-H curve.

The present invention allows the curve of B against time to adopt a form which makes better use of the linear region on the B-H curve, optionally with B centred on zero, much more quickly, optionally with B becoming centred on zero within a time period that is less than or equal to a single period of the alternating voltage being applied. A steady state regime suitable for accurate operation or testing of the component can therefore be achieved with minimal delay.

Embodiments of the invention will now be described, by way of example only, with reference to the accompanying drawings in which corresponding reference symbols indicate corresponding parts, and in which:

FIG. 5 depicts a sinusoidal voltage applied to a component;

FIG. 6 depicts a flux density B that would arise in an ideal coil when the voltage of FIG. 5 is applied to it;

FIG. 7 depicts an applied voltage having a first waveform and a second waveform according to an embodiment;

FIG. 8 depicts a flux density B that would arise in an ideal coil when the voltage of FIG. 7 is applied to it;

FIG. 9 depicts an applied voltage having a first waveform and a second waveform according to a further embodiment;

FIG. 10 depicts a flux density B that would arise in an ideal coil when the voltage of FIG. 9 is applied to it.

Figure 11:
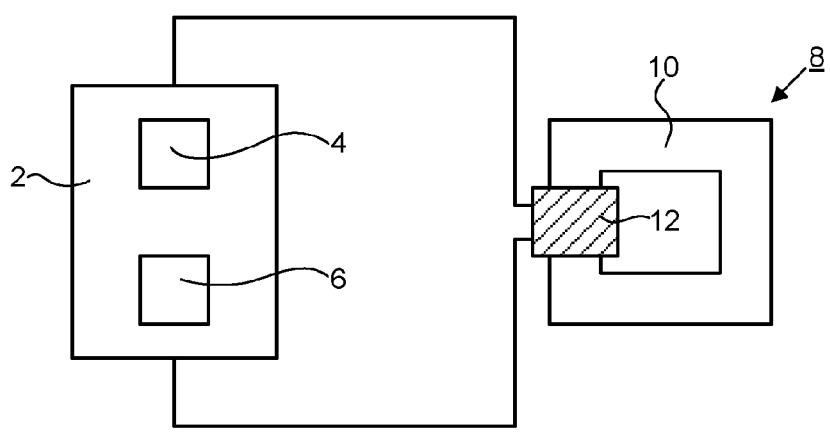
FIG. 11 depicts a testing device configured to measure a response of a component to an energizing of the component according to an embodiment.

Embodiments of the invention relate to energizing a component with an alternating voltage in the case where the component comprises a coil wound on a magnetic core. An example configuration for such a component 8 is shown in FIG. 11. In this particular example, the coil 12 is wound around a portion of a magnetic core 10 formed into a closed loop, but the magnetic core 10 may take any form. In an embodiment the component 8 is a transformer and the coil 12 is a primary coil of the transformer.

A magnetic core comprises a piece of magnetic material with a high permeability. Such cores are used to confine and guide magnetic fields and are well known in a variety of electrical, electromechanical and magnetic applications. Typically, the magnetic core comprises a ferromagnetic metal such as iron, or ferrimagnetic compounds such as ferrites. The high permeability causes magnetic field lines to be concentrated in the core material. The concentration can increase the magnetic fields in the core by a factor of 1000 or more relative to an air or vacuum core.

Driving a current through the coil 12 produces a magnetic field H having a size which is proportional to the current. For relatively low H, the magnetic flux density B increases linearly with H. The linear relationship between B and H persists with increasing H until the magnetic material forming the core begins to saturate (when all of the magnetic domains in the magnetic core are aligned with each other). After saturation, the rate at which B increases with H is greatly reduced.

For practical devices using components based on coils wound on magnetic cores, such as transformers, it is desirable to operate entirely or predominantly within the linear regime (i.e. at magnetic flux densities B which are always below or predominantly below saturation). However, in order to be able to provide the maximum power for a given size of core it is desirable to be able to work close to the saturation limit.

Figure 1:
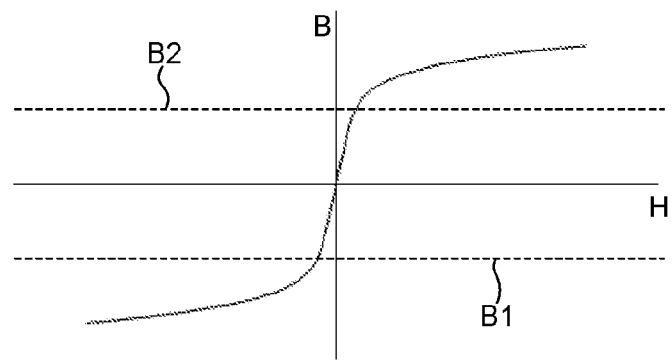
FIG. 1 depicts a typical B-H curve for a magnetic core material.
Figure 2:
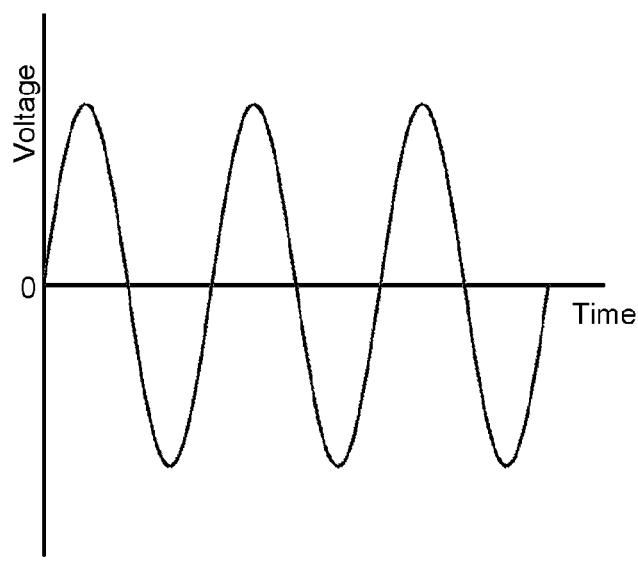
FIG. 2 depicts an example variation in a voltage applied to a component as a function of time.
Figure 3:
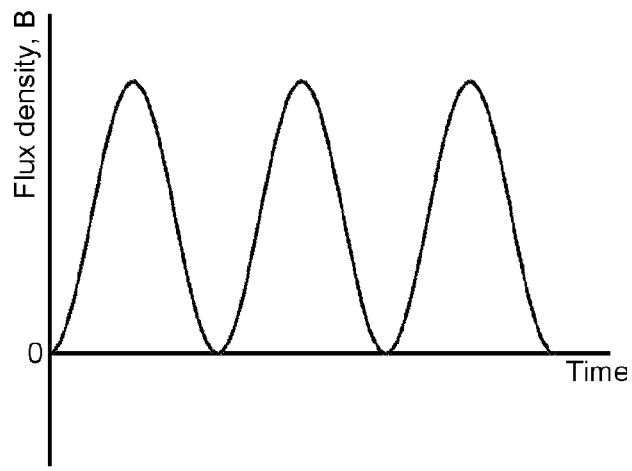
FIG. 3 depicts a variation in magnetic flux density B arising from the voltage applied in FIG. 2 in the case where the voltage is applied to an ideal coil wound on a magnetic core.

The above described variation of B with H is depicted schematically in FIG. 1. This curve is sometimes referred to as the B-H curve or magnetization curve and is well known in the art. The horizontal lines B1 and B2 define the negative and positive limits in the magnetic flux density B defining the linear regime below saturation.

Where a coil 12 is to be energized with an alternating voltage it is desirable that the average flux density is zero (i.e. that the variation with time of B is centred about zero). This allows the maximum amount of the linear regime of the B-H curve to be used. In a practical device the finite electrical resistance of the coil 12 will ensure that in the steady state the magnetic flux density B will indeed tend to vary in this way. However, the inductance of the coil 12 can cause difficulties in a time period immediately after the component is first energized. This can be understood by considering the behaviour of an ideal coil having no electrical resistance (i.e. a purely inductive coil). FIG. 2 depicts an oscillating voltage signal applied to the ideal coil and FIG. 3 depicts the resulting flux density B. In the case of an ideal coil, the voltage in the coil is proportional to the rate of change of magnetic flux linked by the coil. Thus, the magnetic flux density B can be derived by integrating the variation of the applied voltage as a function of time. Integrating the waveform shown in FIG. 2 yields the waveform shown in FIG. 3. As can be seen, the waveform in FIG. 3 is entirely above zero flux density and in the absence of any electrical resistance would remain above zero. This variation of flux density with time is not optimal because it does not make best use of the linear regime in the B-H curve. Indeed, in devices which are designed to occupy a large portion of the linear regime of the B-H curve in the steady state, the behaviour shown in FIG. 3, which will occur approximately even in non-ideal devices for a short time after initial start-up of the device, will tend to cause the magnetic flux density to enter the non-linear regime. The result of the flux density entering the non-linear regime is that the corresponding magnetic field H will increase dramatically for values of flux density B that are greater in magnitude than either of the limits B1 and B2 defining the boundary between the linear and non-linear regimes of the B-H curve. The magnetisation current I in the coil is proportional to the magnetic field H so this effect manifests itself as a large distortion in the current waveform in the region of the peak of the waveform. In practice, the small amount of series resistance of the coils will cause the energy associated with the high current to be dissipated and the variation of magnetic field H, and therefore current, with time will gradually stabilise according to the time constant of the system, $\tau=L/R$, where L is the inductance of the coil and R is the resistance of the coil. Typically, several time constants are needed for the system to fully stabilise. In an example configuration with L=10H and a resistance of 10, the stabilisation process can take 20 to 30 seconds to complete. This means that the component will not operate in a steady or optimal manner for a considerable period of time after start-up. In the case where the component is being energized for the purposes of testing the component, for example for testing the performance of a transformer, this delay in the system reaching a steady state can significantly delay the testing process. In the case where a large number of transformers need to be tested, the delay can greatly increase the total amount of time that is required.

Figure 4:
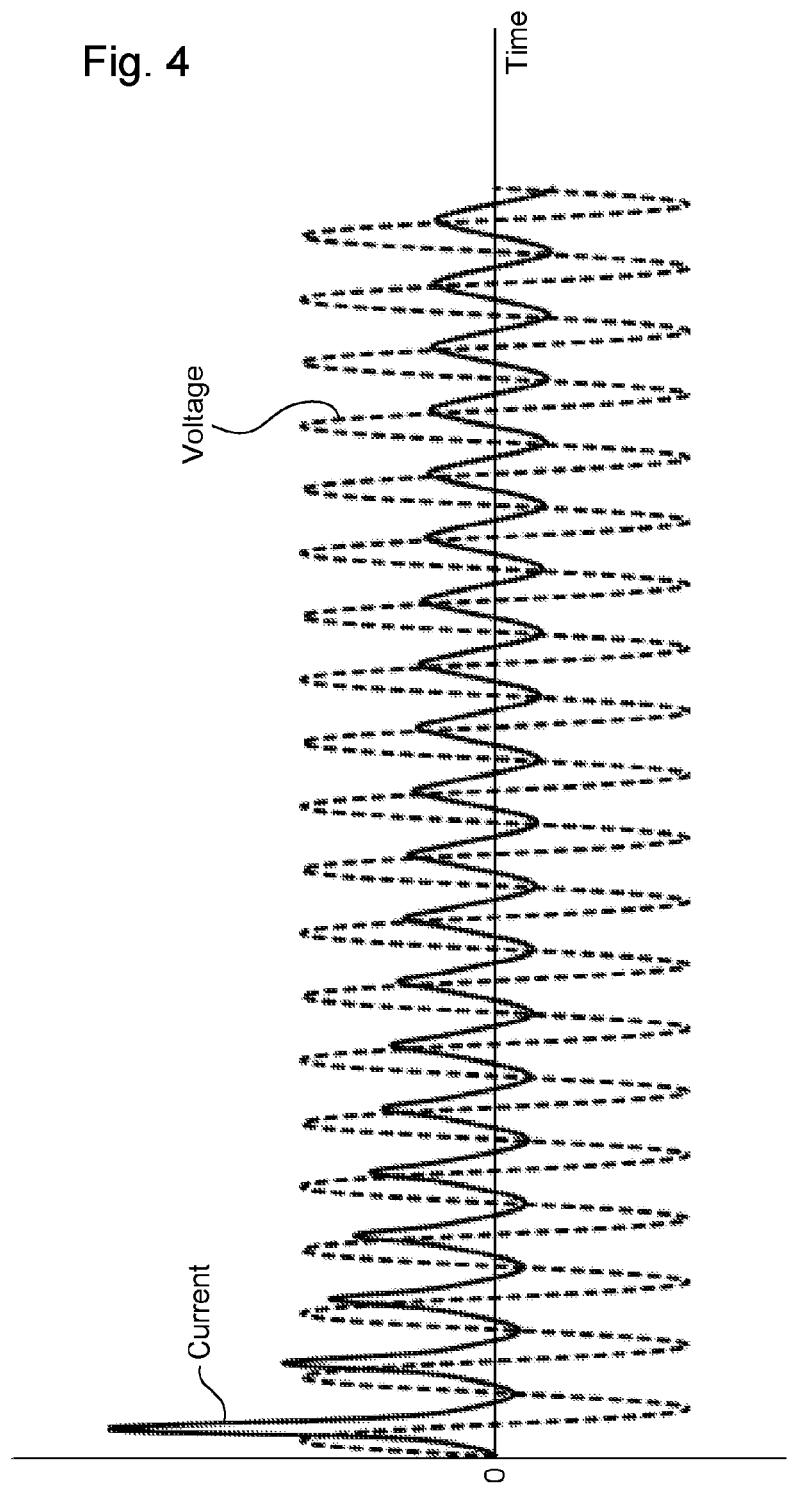
FIG. 4 depicts a variation of voltage across, and current through, a coil having finite electrical resistance.

FIG. 4 shows how the variation of current through a component under test may vary as a function of time in a practical example. As can be seen, in the first few periods of the waveform, the current is predominantly not centred about zero and achieves very high values in comparison with the steady state variation shown at later times (which involves a current, and therefore B, which is centred on zero).

The inventors have recognised the above issues and provide methods, apparatus and devices which provide improvements. Exemplary embodiments are described below with reference to FIGS. 5-11.

In an embodiment, a method of energizing a component 8 with an alternating voltage is provided. The component 8 comprises a coil 12 wound on a magnetic core 10. The method comprises applying a voltage having a first waveform (i.e. a first characteristic variation of voltage with time) during a first time period and a second waveform (i.e. a second characteristic variation of voltage with time) during a second time period. The second time period is subsequent to the first time period. The second waveform comprises an oscillating function comprising a sequence of identical waveforms. The sequence of identical waveforms, and therefore the second waveform, comprises at least two identical waveforms.

The first waveform is such that if the coil 12 had zero electrical resistance (i.e. an ideal coil) the variation of flux density B in the magnetic core 10 with time would change sign at least once during the first waveform. Of course, in practical use the coil 12 will not normally have zero electrical resistance (unless a superconducting coil is being used) and embodiments of the invention are not limited to this. The reference here to an ideal coil is used as a convenient and precise way to define the nature of the first waveform.

FIG. 5 shows an applied voltage which is a pure sinusoid for comparison purposes. The waveform of FIG. 5 does not comprise first and second waveforms according to embodiments of the invention. A first time period is marked 14 and a second time period is marked 16 (for comparison with FIGS. 7 and 9). FIG. 6 shows the resulting variation in B in an ideal coil. It can be seen that applying the voltage waveform of FIG. 5 results in the flux density B in FIG. 6 rising well above the limit B2 every cycle, leading to the peak current distortion discussed above. Furthermore, it is noted that the variation of B with time in FIG. 6 does not make best use of the space available between the limits B1 and B2 because the flux density B is not centred on zero. Indeed, B remains always above zero and does not change sign at any time.

FIGS. 7 and 9 show example voltage waveforms according to embodiments, in which the first waveform is such that if the coil had zero electrical resistance the variation of flux density in the magnetic core with time would change sign at least once during the first waveform. The response that a coil having zero resistance would have is shown respectively in FIGS. 8 and 10.

In an embodiment, examples of which are shown in FIGS. 7 and 9, the duration of the first waveform is equal to or less than a period of the oscillating function. The first waveform in FIG. 7 is the portion of the waveform within the first time period 14 of FIG. 7. The first waveform in FIG. 9 is the portion of the waveform within the first time period 14 of FIG. 9.

In an embodiment, the applied voltage changes sign within a time period that is less than half a period of the oscillation function from a start of the first waveform. An example of an embodiment of this type is shown in FIG. 7 where the polarity changes sign at time point 20. This early change in polarity (relative to FIG. 5 for example) causes a correspondingly early downturn in the variation of B with time, as shown in FIG. 8. The early downturn helps to maintain B within the limits B1 and B2 (contrast with the situation shown in FIG. 6 where there is no such early downturn).

As mentioned above, in embodiments of the invention, as shown for example in FIGS. 7 and 9, the applied voltage comprises a first waveform and a second waveform. In FIGS. 7 and 9, the first waveform is the variation of voltage with time from the start of the first time period 14 to the end of the first time period 14. The second waveform is the variation of voltage with time from the start of the second time period 16 to the end of the second time period 16. The second waveform is characterized by being made up of an oscillating function comprises a sequence of identical waveforms. In the example shown, the oscillating function is a sinusoidal function and each of the identical waveforms is one period of the sinusoidal function.

In an embodiment, examples of which are shown in FIGS. 7 and 9, a single period of the oscillating function consists of a first half-cycle and a second half-cycle, each lasting half the period and with second half-cycle being subsequent to the first half-cycle. Thus, referring for example to FIG. 7, an example of a first half-cycle would be the portion of oscillating function between the start of the second time period 16 and time point 23 (i.e. a positive hump). An example of a second half-cycle is the portion of the oscillating function between time point 23 and time point 25 (i.e. a negative hump).

The first waveform is made up of a modified portion and an unmodified portion. The modified portion is different from the first half-cycle of the single period, and the unmodified portion is identical to the second half-cycle. Thus in the example of FIG. 7 it can be seen that the portion of the first waveform between the start of the first time period 14 and the time point 20 corresponds to the modified portion (because it represents a cut-off version of the first half-cycle half a positive hump), and the portion of the first waveform between the time point 20 and the end of the first time period corresponds to the unmodified portion (it is identical to the second half-cycle of the oscillating function, as shown for example between time points 23 and 25). In the example of FIG. 9, the portion of the first waveform between the start of the first time period 14 and time point 18 corresponds to the modified portion (because it represents a version of the first half-cycle in which the amplitude of the voltage is set to zero for the second half of the half-cycle, between points 20 and 18), and the portion of the first waveform between the time point 18 and the end of the first time period 14 corresponds to the unmodified portion (again, identical to the second half-cycle of the oscillating function, as shown for example between time points 23 and 25).

In embodiments of this type, the modified portion causes the first waveform to differ from the full single period of the oscillating function in such a way that the maximum flux density reached at any time during a time period equal to half a period of the oscillating function from a start of the first waveform is reduced in comparison to a case where the first waveform consists of a full single period of the oscillating function. That this is achieved for the examples of FIGS. 7 and 9 can be seen by comparing the variation of B shown in FIGS. 8 and 10 with the variation of B shown in FIG. 6. The maximum value of B reached at any time prior to time point 18 in FIG. 6 is clearly much higher than the maximum value of B reached at any time prior to time point 18 in FIGS. 8 and 10.

As can be seen from FIGS. 8 and 10, the special waveforms used for the applied voltage cause the flux density B to adopt a variation with time which makes better use of the space between the limits B1 and B2. In the particular arrangements disclosed, the average value of B even in the case where the coil is ideal (with no electrical resistance) quickly becomes centred on zero. The variation of B with time stays entirely within the limits B1 and B2 and problems associated with peak current distortion, which would be an issue in arrangements such as those shown in FIGS. 5 and 6, are greatly reduced or avoided altogether.

The first and second half-cycles referred to above can in general take any form. In embodiments, the first half-cycle is fully positive and the second half-cycle fully negative or the first half-cycle is fully negative and the second half-cycle is fully positive.

In embodiments, an initial part of the modified portion is identical to an initial part of the first half-cycle of the oscillation function (e.g. a sinusoid). In the examples of FIGS. 7 and 9 it can be seen that the waveforms are identical with that of FIG. 5 up to time point 20. In such embodiments, a modification to the first waveform relative to the first half-cycle may be applied from a modification onset time onwards. The modification may comprise any modification which results in the maximum B field that is reached being reduced in comparison to the case where the first waveform is identical to a single period of the oscillating function of the second waveform.

In an embodiment of this type, the modified portion differs from the first half-cycle in that a portion of the first half-cycle is missing from the modified portion. FIG. 7 shows an embodiment of this type, where a second half of the positive hump which would have been present after time point 20 (compare with FIG. 5 for example) is not present and the applied voltage continues immediately with a variation of applied voltage which is the same as a second half-cycle. Thus, the portion of the voltage waveform starting at time point 18 in FIG. 5 is effectively moved backwards in time by a quarter of a cycle in this particular embodiment (as indicated by arrow 22 in FIG. 7). The result of this modification is that, instead of the voltage waveform continuing to remain above zero in the period between time point 20 and time point 18, the voltage waveform immediately goes to zero and then progresses through a negative half cycle of the oscillation function. The result of this variation is shown in FIG. 8. For the period between zero and time point 20, the variation of flux density with time follows the same trajectory as is seen in FIG. 6 between these two time points. However, instead of subsequently continuing above the threshold limit B2, the flux density B in FIG. 8 begins a downturn due to the negative contribution to the flux density caused by the integration of the negative half cycle encountered between time point 20 and the end of the first time period 14 in FIG. 7. When the end of this negative half cycle is reached at the boundary between the first time period 14 and the second time period 16 the variation of flux density B with time reaches its lowest value in FIG. 8 at time point 24. This lowest value is still however above the lower threshold limit B1 and subsequent variation of the flux density B with time remains entirely between the limits B1 and B2, as desired.

In an embodiment, the modified portion differs from the first half-cycle in that an average amplitude of the first waveform between the modification onset time and the end of the modified portion is reduced. In a particular example of such an embodiment the amplitude of the first waveform is set to zero during at least part of the period between the modification onset time and the end of the modified portion. FIG. 9 shows an example of this type, wherein the modification onset time is the time point 20 and the end of the modified portion occurs at time point 18. In the example of FIG. 9, the amplitude is set to zero during all of the period between the modification onset time 20 and the end of the modified half cycle, but this is not essential. In other embodiments, the modification may comprise setting the amplitude of the first waveform to zero during only part of the period between the modification onset time 20 and the end of the modified half cycle. The resulting variation of flux density B with time is shown in FIG. 10. The variation is similar to the variation shown in FIG. 8 and discussed above. The only difference is that instead of immediately turning downwards at time point 20, the flux density B remains at a constant level during the period between the modification onset time 20 and the end of the modified half cycle (at time point 18). From time point 18 onwards, the flux density B varies in the same manner as from time point 20 onwards in FIG. 8, remaining always within the limits B1 and B2.

In an embodiment, examples of which are shown in FIGS. 7-10, the modification onset time 20 is a quarter of a period of the oscillation function after the start of the first waveform. However, this is not essential. The modification onset time may be earlier than a quarter of a period of the oscillation function after the start of the first waveform or later than a quarter of a period of the oscillation function after the start of the first waveform.

Embodiments of the invention are most useful where it is desired to achieve a variation of magnetic flux density which represents a significant proportion of the linear regime of the B-H curve. In practice, this is commonly the case, because if operation is occurring only within a very small proportion of the linear regime of the B-H curve, it is likely that the core being used is larger than is necessary for the application in question, which is generally undesirable because of the additional expense and weight associated with providing a larger core. Given the above, it is generally desirable to operate embodiments of the invention such that the component is configured such that if the first waveform were identical to a single period of the oscillation function, the magnetic flux density in the magnetic core 10 would be driven beyond a linear region in the curve of magnetic flux density B against magnetic field H, and the first waveform differs from a single period of the oscillation function in such a way that the magnetic core 10 is not driven beyond the linear region of the curve.

Methods of energizing a component with an alternating voltage according to embodiments of the invention may be particularly useful in the context of testing components comprising a coil wound on a magnetic core. In such contexts, the testing may comprise for example measuring a response (e.g. a current) of the component to the energization. For example, a voltage could be applied to the coil and the resulting current could be measured over a period of time. Using the applied voltage waveforms of embodiments, which help to avoid the non-linear regime of the B-H curve, facilitates carrying out the testing without having to wait too long (or at all) for a steady state condition to be reached. Accurate measurements can thus be obtained much more quickly than is possible with prior art arrangements. This testing methodology may be applied particularly advantageously, for example, to transformer testing.

FIG. 11 is a schematic diagram showing an apparatus for carrying out a method according to an embodiment. The apparatus 2 may be referred to as an apparatus for energizing a component 8 with an alternating voltage. The component 8 comprises a coil 12 wound on a magnetic core 10. The apparatus comprises a power source 4 configured to apply a voltage having a first waveform during a first time period and a second waveform during a second time period. The second time period is subsequent to the first time period. The second waveform comprises an oscillating function comprising a sequence of identical waveforms. The first waveform is such that if the coil 12 had zero electrical resistance the variation of flux density with time would change sign at least once during the first waveform, as discussed in the embodiments above. Thus, the apparatus 2 may be configured to carry out any of the methods of embodiments of the invention. The first and second waveforms may be configured as described above, for example, with reference to FIGS. 7-10.

The apparatus 2 of FIG. 11 may be configured to operate as a testing device configured to measure a response of the component 8 to an energizing of the component 8. In this case, the testing device may comprise the apparatus 2 and a measurement system 6 configured to measure a response of the component 8 to the energization. The measurement system 6 may for example comprise apparatus for measuring a current flowing through the coil 12. The component 8 may be a transformer.

The features defined in the claims can be combined together in any combination.

The invention claimed is:

1. A method of energizing a component with an alternating voltage, the component comprising a coil wound on a magnetic core, wherein the method comprises:
    applying a voltage across the coil that has a first waveform during a first time period and a second waveform during a second time period, the second time period being subsequent to the first time period, wherein
    the second waveform comprises an oscillating function comprising a sequence of identical waveforms; and
    the first waveform is such that if the coil had zero electrical resistance the variation of flux density in the magnetic core with time would change sign at least once during the first waveform, wherein a single period of the oscillating function consists of a first half-cycle lasting half the period and a second half-cycle lasting half the period, the second half-cycle being subsequent to the first half-cycle,
    the first waveform is made up of a modified portion and an unmodified portion, the unmodified portion being subsequent to the modified portion, wherein the modified portion is different from the first half-cycle of the single period and the unmodified portion is identical to the second half-cycle of the single period, and
    the modified portion is such that the maximum flux density reached at any time during a time period equal to half the period of the oscillating function, from the start of the first waveform, is reduced in comparison to what would be the case if the first waveform consisted of a single period of the oscillating function.

2. The method of claim 1, wherein the duration of the first waveform is equal to or less than a period of the oscillating function.

3. The method of claim 1, wherein the applied voltage changes sign within a time period which is less than half a period of the oscillating function from a start of the first waveform.

4. The method of claim 1, wherein the component is configured such that if the first waveform were identical to a single period of the oscillating function, the magnetic flux density in the magnetic core would be driven beyond a linear region of a curve of magnetic flux density against magnetic field, and the first waveform differs from a single period of the oscillating function in such a way that the magnetic core is not driven beyond the linear region of the curve.

5. A method of testing a component comprising a coil wound on a magnetic core comprising:
energizing the component using the method of claim 1, and
measuring a response of the component to the energization.

6. The method of claim 5, wherein the measuring of the response comprises measuring a current flowing through the coil.

7. The method of claim 1, wherein the component is a transformer.

8. The method of claim 7, wherein the first half-cycle is fully positive and the second half-cycle is fully negative or the first half-cycle is fully negative and the second half-cycle is fully positive.

9. The method of claim 7, wherein an initial part of the modified portion is identical to an initial part of the first half-cycle, a modification to the waveform relative to the first half-cycle being applied from a modification onset time onwards.

10. The method of claim 9, wherein the modified portion differs from the first half-cycle in that an average amplitude of the first waveform between the modification onset time and the end of the modified portion is reduced.

11. The method of claim 10, wherein the amplitude of the first waveform is set to zero during at least part of the period between the modification onset time and the end of the modified portion.

12. The method of claim 9, wherein the modification onset time is a quarter of a period of the oscillation function after the start of the first waveform.

13. The method of claim 9, wherein the modified portion differs from the first half-cycle in that a portion of the first half-cycle is missing from the modified portion.

14. The method of claim 1, wherein the coil has a finite resistance.

15. An apparatus for energizing a component with an alternating voltage, the component comprising a coil wound on a magnetic core, wherein the apparatus comprises:
a power source configured to apply a voltage having a first waveform during a first time period and a second waveform during a second time period, the second time period being subsequent to the first time period, wherein
the second waveform comprises an oscillating function comprising a sequence of identical waveforms; and
the first waveform is such that if the coil had zero electrical resistance the variation of flux density with time would change sign at least once during the first waveform, wherein a single period of the oscillating function consists of a first half-cycle lasting half the period and a second half-cycle lasting half the period, the second half-cycle being subsequent to the first half-cycle,
the first waveform is made up of a modified portion and an unmodified portion, the unmodified portion being subsequent to the modified portion, wherein the modified portion is different from the first half-cycle of the single period and the unmodified portion is identical to the second half-cycle of the single period, and
the modified portion is such that the maximum flux density reached at any time during a time period equal to half the period of the oscillating function, from the start of the first waveform, is reduced in comparison to what would be the case if the first waveform consisted of a single period of the oscillating function.

16. A testing device configured to measure a response of a component to an energizing of the component, the component comprising a coil wound on a magnetic core, comprising:
the apparatus for energizing the component of claim 15; and
a measurement system configured to measure a response of the component to the energization.

17. The device of claim 16, wherein the measurement system is configured to measure a current flowing through the coil.

18. The testing device of claim 16, wherein the component comprises a transformer.

19. The apparatus of claim 15, wherein the component comprises a transformer.

* * * * *